(12) United States Patent
Kolics et al.

(10) Patent No.: US 9,006,893 B2
(45) Date of Patent: Apr. 14, 2015

(54) DEVICES FOR METALLIZATION

(71) Applicant: Lam Research Corporation, Fremont, CA (US)

(72) Inventors: Artur Kolics, Fremont, CA (US); William T. Lee, Dublin, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/973,382

(22) Filed: Aug. 22, 2013

(65) Prior Publication Data

US 2014/0054776 A1    Feb. 27, 2014

Related U.S. Application Data

(62) Division of application No. 12/832,034, filed on Jul. 7, 2010, now Pat. No. 8,518,815.

(51) Int. Cl.
*H01L 23/48* (2006.01)
*H01L 21/768* (2006.01)
*H01L 23/00* (2006.01)

(52) U.S. Cl.
CPC .......... *H01L 24/04* (2013.01); *H01L 21/76849* (2013.01); *H01L 23/481* (2013.01); *H01L 24/03* (2013.01); *H01L 24/05* (2013.01); *H01L 2224/03464* (2013.01); *H01L 2224/0401* (2013.01); *H01L 2224/05026* (2013.01); *H01L 2224/05099* (2013.01); *H01L 2224/05124* (2013.01); *H01L 2224/05147* (2013.01); *H01L 2224/05155* (2013.01); *H01L 2224/05157* (2013.01); *H01L 2224/05571* (2013.01); *H01L 2224/05573* (2013.01); *H01L 2224/05599* (2013.01); *H01L 2224/05611* (2013.01); *H01L 2224/05639* (2013.01); *H01L 2224/05647* (2013.01); *H01L 2224/05655* (2013.01); *H01L 2224/05657* (2013.01);

(Continued)

(58) Field of Classification Search
USPC ................. 257/751, 737–738, 773, 780–782, 257/E21.506, E23.01, E23.017; 438/106, 438/612–614
See application file for complete search history.

(56) References Cited

U.S. PATENT DOCUMENTS 5,736,456 A    4/1998   Akram
6,489,229 B1  12/2002   Sheridan et al.

(Continued)

FOREIGN PATENT DOCUMENTS

CN   1853263        10/2006
WO   2012004710 A2   1/2012
WO   2012004710 A3   1/2012

OTHER PUBLICATIONS

Wafer Bumping Technologies—A Comparative Analyis of Solder Deposition Processes and Assembly Considerations, D. Patterson, et al., Flip Chip Technologies, Available online at http://www.rosestreetlabs.com/FCI/PDF/PATTERSON2.PDF.

(Continued)

*Primary Examiner* — Dung A. Le
(74) *Attorney, Agent, or Firm* — Beyer Law Group LLP

(57) ABSTRACT

An electronic device which in one embodiment comprises a metallization stack is provided. The metallization stack comprises a barrier metal deposited electrolessly and a substantially gold-free wetting layer deposited electrolessly. Additionally, the barrier metal contacts the wetting layer, where the wetting layer is wettable by solder.

17 Claims, 2 Drawing Sheets

(52) U.S. Cl.
CPC .. *H01L 2224/05666* (2013.01); *H01L 2224/13* (2013.01); *H01L 2224/13023* (2013.01); *H01L 2224/13025* (2013.01); *H01L 2224/13099* (2013.01); *H01L 2224/131* (2013.01); *H01L 2224/13599* (2013.01); *H01L 2224/29099* (2013.01); *H01L 2224/29599* (2013.01); *H01L 2924/00012* (2013.01); *H01L 2924/00013* (2013.01); *H01L 2924/00014* (2013.01); *H01L 2924/01029* (2013.01); *H01L 2924/01047* (2013.01); *H01L 2924/0105* (2013.01); *H01L 2924/01074* (2013.01); *H01L 2924/014* (2013.01)

(56) References Cited

U.S. PATENT DOCUMENTS

| | | |
|---|---|---|
| 6,943,106 B1 | 9/2005 | Kirby et al. |
| 7,095,116 B1 | 8/2006 | Kelkar et al. |
| 7,276,801 B2 | 10/2007 | Dubin et al. |
| 7,682,961 B2 | 3/2010 | Daubenspeck et al. |
| 7,691,747 B2 | 4/2010 | Lin et al. |
| 7,727,876 B2 | 6/2010 | Lin et al. |
| 2005/0279812 A1 | 12/2005 | Tago et al. |
| 2006/0043156 A1* | 3/2006 | Debelius et al. ......... 228/180.22 |
| 2009/0008801 A1 | 1/2009 | Lai et al. |
| 2009/0057909 A1 | 3/2009 | Strothmann |
| 2009/0243098 A1* | 10/2009 | Farooq et al. ................. 257/738 |
| 2010/0032843 A1 | 2/2010 | Chen et al. |
| 2010/0047963 A1 | 2/2010 | Wang et al. |
| 2010/0062597 A1 | 3/2010 | Belanger et al. |

OTHER PUBLICATIONS

Electroless Sn—Ni Alloy Plating With High Sn Content Free of Activation Pretreatment, Yong Kong, et al., Journal of Alloys and Compounds, 477 (2009) pp. 328-332.

Preparation of Ni—Sn Alloys by an Electroless-Deposition Method, Hidenori Shimauchi, et al., Journal of Electrochemical Society, vol. 141 (1994) pp. 1471-1476.

* cited by examiner

DEVICES FOR METALLIZATION

The present application is a divisional of U.S. patent application Ser. No. 12/832,034, titled "METHODS, DEVICES, AND MATERIALS FOR METALLIZATION," to KOLICS et al., filed Jul. 7, 2010, projected issue date Aug. 27, 2013, projected U.S. Pat. No. 8,518,815. U.S. patent application Ser. No. 12/832,034 (U.S. Pat. No. 8,518,815) is incorporated herein, in its entirety, by this reference for all purposes.

BACKGROUND

One or more embodiments of this invention pertain to fabrication of electronic devices such as integrated circuits; more specifically, one or more embodiments of this invention relate to materials and metallization layers for structures that include solder contacts.

Solder contacts for electrical connections have been in use in electronic devices for a long time. Numerous established processes exist and are in use for fabricating such devices. Many of these processes have provided satisfactory results and few, if any, major improvements have been made to many of these established processes.

The present inventors have made one or more discoveries that may be pertinent to solder contact technology such as that for electronic devices. The one or more discoveries may have the potential to provide one or more methods, materials, and/or electronic devices that involve or use solder contact technology.

SUMMARY

One or more aspects of this invention pertain to fabrication of electronic devices. One aspect of the present invention is a method of making an electronic device. According to one embodiment, the method comprises providing a substrate, electrolessly depositing a barrier metal at least on portions of the substrate; and using wet chemistry such as electroless deposition to deposit a substantially gold-free wetting layer having solder wettability onto the barrier metal.

Another aspect of the present invention is an electronic device. According to one embodiment, the electronic device comprises a metallization stack. The metallization stack comprises a barrier metal deposited electrolessly and a substantially gold-free wetting layer deposited on the barrier metal, and the wetting layer is wettable by solder.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting.

Skilled artisans appreciate that elements in the figures are illustrated for simplicity and clarity and have not necessarily been drawn to scale. For example, the dimensions of some of the elements in the figures may be exaggerated relative to other elements to help to improve understanding embodiments of the present invention.

DESCRIPTION

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc. A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

One or more embodiments of the present invention pertain to methods, devices, materials, and/or metallization layers for structures that include solder. More specifically, the present invention is directed toward materials and metallization layers for electronic devices that comprise solder.

Embodiments of the present invention will be discussed below primarily in the context of processing semiconductor wafers such as silicon wafers used for fabricating electronic devices. The electronic devices include copper and/or another electrical conductor. The electronic devices have one or more electrical connections that include solder. However, it is to be understood that embodiments in accordance with the present invention may be used for other types of semiconductor devices and wafers other than semiconductor wafers.

Figure 1:
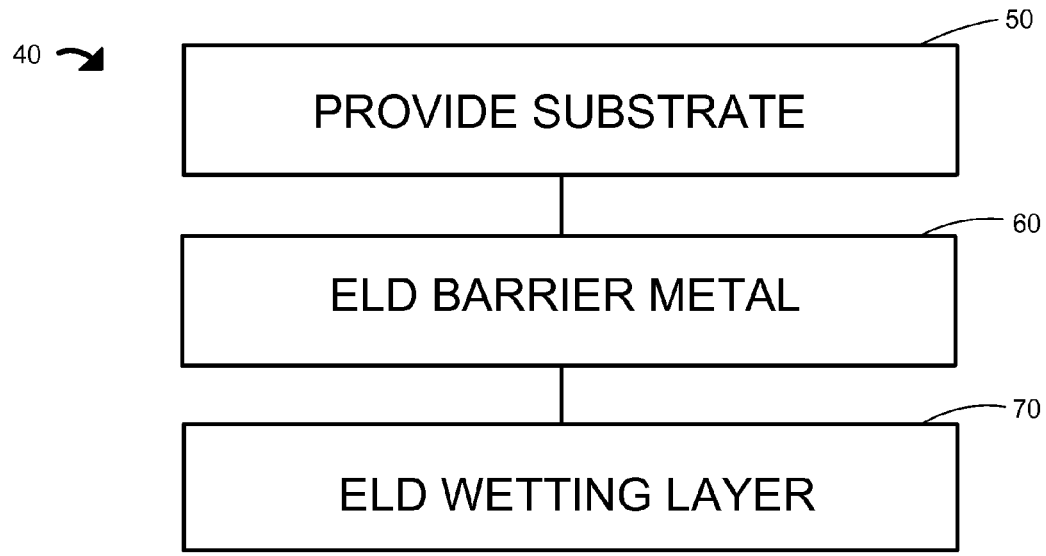
FIG. 1 is a process flow diagram of an embodiment of the present invention.

Reference is now made to FIG. 1 where there is shown a process flow diagram 40 according to an embodiment of the present invention. Process flow diagram 40 includes providing a substrate 50. Optionally, the substrate may be a substrate such as a semiconductor wafer such as a silicon wafer or a substrate of another material suitable for fabricating electronic devices. Process flow diagram 40 comprises electrolessly depositing (ELD) a barrier metal 60 at least over portions of the substrate. Process flow diagram 40 also comprises wet chemical deposit such as electrolessly depositing a wetting layer 70. The wetting layer is a substantially gold-free wetting layer having solder wettability. The wetting layer is deposited on the barrier metal. Optionally, a process flow diagram for an embodiment of the present invention may include process flow diagram 40 further comprising forming solder contacts with the wetting layer.

In process flow diagram 40, the providing a substrate 50 may be accomplished using a variety of substrates. In other words, a variety of substrates may be used in process flow diagram 40 for additional embodiments of the present invention. As an option for process flow diagram 40, the providing a substrate 50 comprises providing a substrate comprising one or more electrical contact pads, and the electrolessly depositing a barrier metal 60 comprises electrolessly depositing the barrier metal onto the one or more electrical contact pads.

As another option for process flow diagram 40, the providing a substrate 50 comprises providing a substrate comprising one or more through substrate via conductors, and the electrolessly depositing a barrier metal 60 comprises electrolessly depositing the barrier metal onto the one or more through substrate via conductors.

As still another option for process flow diagram 40, the providing a substrate 50 comprises providing a substrate comprising one or more vias, and the electrolessly depositing a barrier metal 60 comprises electrolessly depositing the barrier metal onto the walls of the one or more vias.

Examples of suitable barrier metals for use in process flow diagram 40 include, but are not limited to, electrolessly deposited nickel, electrolessly deposited nickel alloy, electrolessly deposited cobalt, and electrolessly deposited cobalt alloy. According to one or more embodiments of the present invention, process flow diagram 40 comprises depositing the barrier metal to a thickness of 0.2 micrometer to 1 micrometer and all values and ranges subsumed therein.

For some embodiments of the present invention, the barrier metal is electrolessly deposited without using palladium or other precious metals to act as activation metals to initiate the deposition process. Instead of using palladium or other precious metals for surface activation, one or more embodiments of the present invention use electroless deposition baths that comprise reducing agents such as borane for the electroless deposition process. The use of borane as at least one of the reducing agents in an electroless deposition bath, according to one or more embodiments of the present invention may avoid the formation of black pads that are typically associated with nickel phosphorus barrier layers with gold wetting layers.

Process flow diagram 40 can be modified for a variety of embodiments of the present invention that comprise using one or more options for electrolessly depositing wetting layer 70. Options for process flow diagram 40 for electrolessly depositing the wetting layer 70 include, but are not limited to: Electrolessly depositing a substantially gold-free wetting layer that comprises electrolessly depositing tin or a tin alloy. Electrolessly depositing a substantially gold-free wetting layer that comprises electrolessly depositing silver or a silver alloy. Electrolessly depositing a substantially gold-free wetting layer that comprises electrolessly depositing silver tungsten alloy with 3-4 atomic percent tungsten. Electrolessly depositing a substantially gold-free wetting layer that comprises electrolessly depositing cobalt tin alloy, cobalt copper alloy, cobalt silver alloy, cobalt copper tin alloy, cobalt copper silver alloy, cobalt silver tin alloy, or cobalt copper silver tin alloy. Electrolessly depositing a substantially gold-free wetting layer that comprises electrolessly depositing nickel copper alloy, nickel silver alloy, nickel copper silver alloy, nickel copper tin alloy, nickel silver tin alloy, or nickel copper silver tin alloy. Electrolessly depositing a substantially gold-free wetting layer that comprises electrolessly depositing iron tin alloy, iron copper alloy, iron silver alloy, iron copper tin alloy, iron copper silver alloy, iron silver tin alloy, or iron copper silver tin alloy. Electrolessly depositing a substantially gold-free wetting layer that comprises electrolessly depositing a thickness of nickel alloy having a first composition and a thickness of nickel alloy having a second composition. Electrolessly depositing a substantially gold-free wetting layer that comprises electrolessly depositing a thickness of cobalt alloy having a first composition and a thickness of cobalt alloy having a second composition. Electrolessly depositing a substantially gold-free wetting layer that comprises electrolessly depositing a thickness of iron alloy having a first composition and a thickness of iron alloy having a second composition. Optionally, one or more embodiments of the present invention may further comprise incorporating boron and/or phosphorus in the substantially gold-free wetting layer. For some embodiments of the present invention, one or more of the options for electrolessly depositing a wetting layer 70 may be combined.

For some embodiments of the present invention, process flow diagram 40 may further comprise using one or more corrosion prevention procedures on the surface of the wetting layer to keep the surface suitable for making solder contact. Examples of corrosion prevention procedures that may be suitable for embodiments of the present invention include, but are not limited to, depositing a corrosion protective film on the wetting layer; forming an organic solderabily preservative layer; rinsing the wetting layer with a solution containing a corrosion inhibitor; and adjusting the composition of the surface of the wetting layer so that it is less susceptible to corrosion.

As indicated above, one or more embodiments of the present invention comprise using wetting layers in which the composition of the wetting layer is not constant through the thickness of the wetting layer. For embodiments of the present invention that comprise electrolessly depositing a thickness of nickel alloy having a first composition and a thickness of nickel alloy having a second composition, the composition change can be accomplished by changing one or more deposition conditions such as the temperature for the deposition process, and such as the composition of the plating formulation. Embodiments of the present invention that comprise electrolessly depositing a thickness of cobalt alloy having a first composition and a thickness of cobalt alloy having a second composition can also use changes in one or more deposition conditions to accomplish the changes in composition of the wetting layer. Embodiments of the present invention that comprise electrolessly depositing a thickness of iron alloy having a first composition and a thickness of iron alloy having a second composition can also use changes in one or more deposition conditions to accomplish the changes in composition of the wetting layer.

One or more embodiments of the present invention include methods according to process flow diagram 40 wherein the electrolessly depositing a barrier metal at least over portions of the substrate 60 and the electrolessly depositing a substantially gold-free wetting layer 70 having solder wettability are accomplished using an electroless deposition bath composition at a temperature T1 to deposit the barrier metal and using the electroless deposition bath composition at another temperature T2 to deposit the wetting layer wherein T1 does not equal T2. In other words, T1 and T2 are sufficiently different to cause electroless deposition of materials having different compositions from the same electroless deposition bath composition. Alternatively, the electrolessly depositing a barrier metal at least over portions of the substrate 60 and the electrolessly depositing a substantially gold-free wetting layer 70 having solder wettability are accomplished using an electroless deposition bath composition over a range of temperatures TR1 to deposit the barrier metal and using the electroless deposition bath composition over another range of temperatures TR2 to deposit the wetting layer wherein TR1 and TR2 are dissimilar. In other words, TR1 and TR2 are sufficiently different to cause electroless deposition of materials having different compositions from the same electroless deposition bath composition. For one or more embodiments, the thickness composition profile of the barrier metal may vary as a result of the temperature variation in TR1 and/or the thickness composition profile of the wetting layer may vary as a result of the temperature variation in TR2.

Another embodiment of the present invention includes a method of making an electronic device. The method comprises providing a substrate 50 that comprises providing a substrate that comprises one or more electrical contact pads and/or one or more through-substrate via conductors. The method also comprises electrolessly depositing a barrier metal 60 that comprises electrolessly depositing a barrier metal that comprises at least one of the elements nickel and cobalt. The barrier layer has a thickness of 0.2 micrometer to 1 micrometer and all values and ranges subsumed therein at least over portions of the one or more electrical contact pads and/or the one or more through-substrate via conductors. For electrolessly depositing a wetting layer 70, the method comprises electrolessly depositing at least one of: tin or a tin alloy; silver tungsten alloy with 3-4 atomic percent tungsten; copper or a copper alloy; cobalt tin alloy; cobalt copper alloy; cobalt silver alloy; cobalt copper tin alloy; cobalt copper silver alloy; cobalt silver tin alloy; cobalt copper silver tin alloy; nickel copper alloy; nickel silver alloy; nickel copper silver alloy; nickel copper tin alloy; nickel silver tin alloy; nickel copper silver tin alloy; iron tin alloy; iron copper alloy; iron silver alloy; iron copper tin alloy; iron copper silver alloy; iron silver tin alloy; iron copper silver tin alloy; a thickness of nickel alloy having a first composition and a thickness of nickel alloy having a second composition; a thickness of cobalt alloy having a first composition and a thickness of cobalt alloy having a second composition; and a thickness of iron alloy having a first composition and a thickness of iron alloy having a second composition to contact the barrier metal so as to form a substantially gold-free wetting layer having solder wettability. Optionally, the method may further comprise incorporating boron and/or phosphorus in the substantially gold-free wetting layer. The method also comprises forming a solder contact to the substantially gold-free wetting layer.

Figure 2:
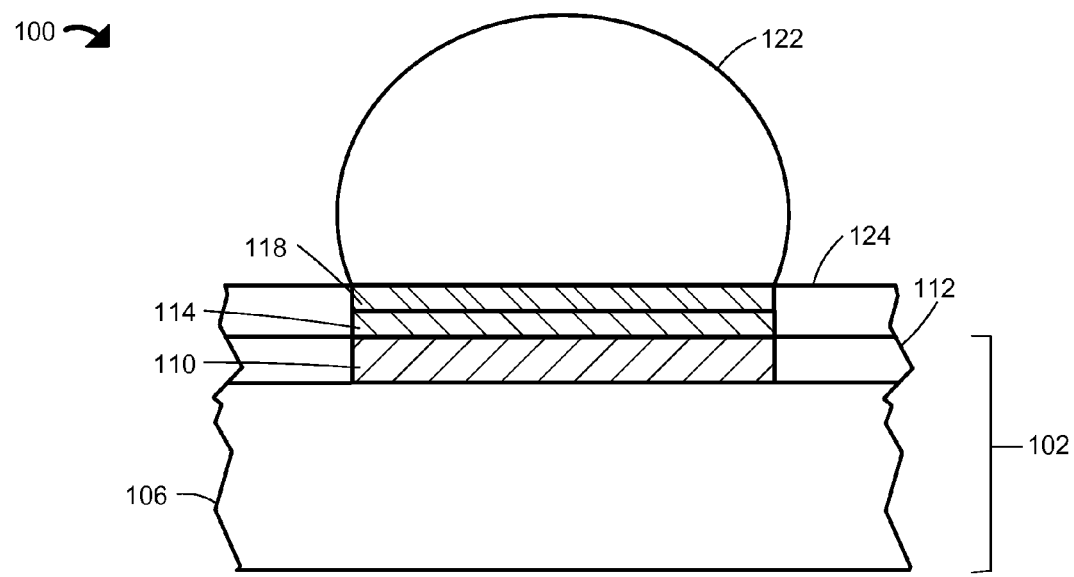
FIG. 2 is a diagram of an embodiment of the present invention.

Reference is now made to FIG. 2 where there is shown a cross-section side view of a part of an electronic device 100 according to one embodiment of the present invention. Electronic device 100 comprises a substrate 102 having a base 106, contact pad 110 supported on base 106, and a passivation layer 112 over base 106. Electronic device 100 further comprises a metallization stack comprising an electrolessly deposited barrier metal 114 on electrical contact pad 110 and an electrolessly deposited substantially gold-free wetting layer 118 on barrier metal 114. Wetting layer 118 is wettable by solder. Electronic device 100 further includes solder 122 contacting wetting layer 118. FIG. 2 shows solder 122 as a solder ball that may be used for making another electrical contact. FIG. 2 also shows electronic device 100 having optional passivation layer 124.

For some embodiments of electronic device 100, substrate 102 may comprise a completed or partially completed integrated circuit device. Optionally base 106 may be a semiconductor such as silicon or it may be another material suitable for the fabrication of electronic devices. Optionally, contact pad 110 may comprise a contact pad such as a final metal contact pad for electronic devices such as an aluminum contact pad and such as a copper contact pad. One or more embodiments of the present invention comprise having electrical contact pad 110 at least partially covered by barrier metal 114.

One or more embodiments of the present invention include barrier metal 114 comprising at least one of the elements nickel and cobalt. According to one embodiment of the present invention, electronic device 100 has a thickness of barrier metal 114 that is about 0.2 micrometer to 1 micrometer and all values and ranges subsumed therein. For one or more embodiments of the present invention, barrier metal 114 comprises at least one of the elements nickel and cobalt and a thickness of the barrier metal 114 is about 0.2 micrometer to 1 micrometer and all values and ranges subsumed therein.

Additional embodiments of the present invention may have wetting layer 118 comprising one or more of a variety of materials systems. Examples of materials systems suitable for use as wetting layer 118 include, but are not limited to: Wetting layer 118 comprising tin or a tin alloy. Wetting layer 118 comprising silver or a silver alloy. Wetting layer 118 comprising silver tungsten alloy with 3-4 atomic percent tungsten. Wetting layer 118 comprising copper or a copper alloy. Wetting layer 118 comprising cobalt tin alloy, cobalt copper alloy, cobalt silver alloy, cobalt copper tin alloy, cobalt copper silver alloy, cobalt silver tin alloy, or cobalt copper silver tin alloy. Wetting layer 118 comprising nickel copper alloy, nickel silver alloy, nickel copper silver alloy, nickel copper tin alloy, nickel silver tin alloy, or nickel copper silver tin alloy. Wetting layer 118 comprising iron tin alloy, iron copper alloy, iron silver alloy, iron copper tin alloy, iron copper silver alloy, iron silver tin alloy, or iron copper silver tin alloy. Wetting layer 118 comprising a thickness of nickel alloy having a first composition and a thickness of nickel alloy having a second composition. Wetting layer 118 comprising a thickness of cobalt alloy having a first composition and a thickness of cobalt alloy having a second composition. Wetting layer 118 comprising a thickness of iron alloy having a first composition and a thickness of iron alloy having a second composition. Wetting layer 118 further comprising boron and/or phosphorus.

Figure 3:
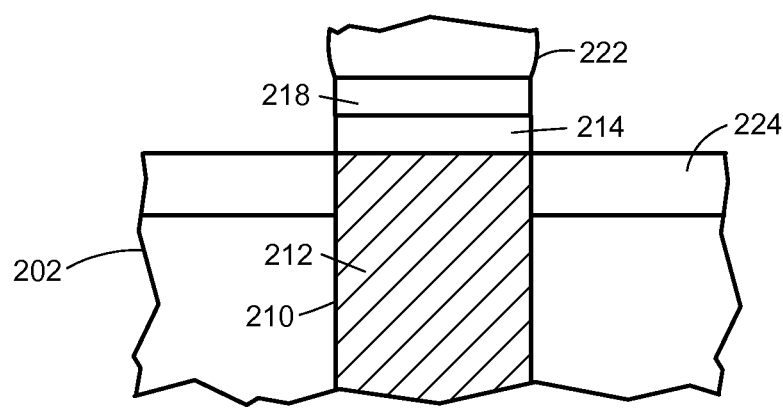
FIG. 3 is a diagram of an embodiment of the present invention.

Reference is now made to FIG. 3 where there is shown a cross-section side view of a part of an electronic device 200 according to one embodiment of the present invention. Electronic device 200 comprises a substrate 202 having a through-substrate via 210, and a through-substrate via electrical conductor 212. Electronic device 200 also includes a passivation layer 224 over substrate 202. Electronic device 200 further comprises a metallization stack comprising an electrolessly deposited barrier metal 214 on electrical conductor 212 and a substantially gold-free wetting layer 218 on barrier metal 214. As an option, substantially gold-free wetting layer 218 is deposited on barrier metal 214 electrolessly. Wetting layer 218 is wettable by solder. Electronic device 200 further includes solder 222 contacting wetting layer 218.

For some embodiments of electronic device 200, substrate 202 may comprise a completed or partially completed integrated circuit device. Optionally, substrate 202 may be a semiconductor such as silicon or it may be another material suitable for the fabrication of electronic devices. Optionally, through-substrate via electrical conductor 212 may comprise an electrical conductor such as, but not limited to, aluminum, copper, polysilicon, solder, and tungsten. One or more embodiments of the present invention comprise having through-substrate via electrical conductor 212 at least partially covered by barrier metal 214.

One or more embodiments of the present invention include barrier metal 214 comprising at least one of the elements nickel and cobalt. According to one embodiment of the present invention, electronic device 200 has a thickness of barrier metal 214 that is about 0.2 micrometer to 1 micrometer and all values and ranges subsumed therein. For one or more embodiments of the present invention barrier metal 214 comprises at least one of the elements nickel and cobalt and a thickness of the barrier metal 214 is about 0.2 micrometer to 1 micrometer and all values and ranges subsumed therein.

Additional embodiments of the present invention may have wetting layer 218 comprising one or more of a variety of materials systems. Examples of materials systems suitable for use as wetting layer 218 include, but are not limited to: Wetting layer 218 comprising tin or a tin alloy. Wetting layer 218 comprising silver or a silver alloy. Wetting layer 218 comprising silver tungsten alloy with 3-4 atomic percent tungsten. Wetting layer 218 comprising copper or a copper alloy. Wetting layer 218 comprising cobalt tin alloy, cobalt copper alloy, cobalt silver alloy, cobalt copper tin alloy, cobalt copper silver alloy, cobalt silver tin alloy, or cobalt copper silver tin alloy. Wetting layer 218 comprising nickel copper alloy, nickel silver alloy, nickel copper silver alloy, nickel copper tin alloy, nickel silver tin alloy, or nickel copper silver tin alloy. Wetting layer 218 comprising iron tin alloy, iron copper alloy, iron silver alloy, iron copper tin alloy, iron copper silver alloy, iron silver tin alloy, or iron copper silver tin alloy. Wetting layer 218 comprising a thickness of nickel alloy having a first composition and a thickness of nickel alloy having a second composition. Wetting layer 218 comprising a thickness of cobalt alloy having a first composition and a thickness of cobalt alloy having a second composition. Wetting layer 218 comprising a thickness of iron alloy having a first composition and a thickness of iron alloy having a second composition. Wetting layer 218 further comprising boron and/or phosphorus.

Another embodiment of the present invention includes an electronic device comprising a metallization stack. The metallization stack comprises a barrier metal deposited electrolessly and a substantially gold-free wetting layer deposited electrolessly on the barrier metal. The barrier metal electrically contacts the wetting layer, and the wetting layer is wettable by solder. The barrier metal has a thickness of 0.2 micrometer to 1 micrometer and all values and ranges subsumed therein. The barrier metal comprises at least one of the elements nickel and cobalt. The wetting layer comprises: tin or a tin alloy; silver or a silver alloy; silver tungsten alloy with 3-4 atomic percent tungsten; copper or a copper alloy; cobalt tin alloy; cobalt tin alloy including boron and/or phosphorus; nickel tin alloy; nickel tin alloy including boron and/or phosphorus; a thickness of nickel tin alloy having a first composition and a thickness of nickel tin alloy having a second composition; or a thickness of cobalt tin alloy having a first composition and a thickness of cobalt tin alloy having a second composition. The electronic device further comprises one or more electrical contact pads that are at least partially covered by the barrier metal and/or one or more through-substrate via conductors that are at least partially covered by the barrier metal. The embodiment also comprises solder contacting the wetting layer.

Figure 4:
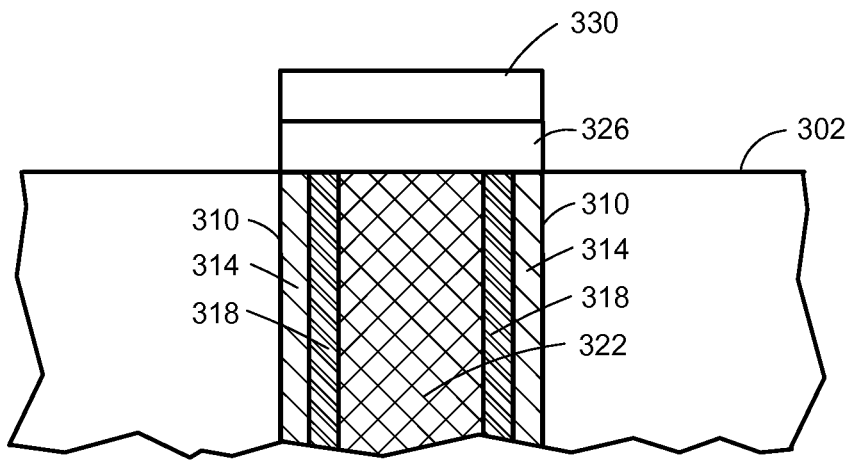
FIG. 4 is a diagram of an embodiment of the present invention.

Reference is now made to FIG. 4 where there is shown a cross-section side view of a part of an electronic device 300 according to one embodiment of the present invention. Electronic device 300 comprises a substrate 302 having a through-substrate via 310. Electronic device 300 further comprises a through-substrate electrical conductor comprising an electrolessly deposited barrier metal 314 to substantially cover the walls of through substrate via 310 and a substantially gold-free wetting layer 318 on barrier metal 314. As an option, substantially gold-free wetting layer 318 is deposited on barrier metal 314 electrolessly. Wetting layer 318 is wettable by solder. Electronic device 300 further includes solder 322 contacting wetting layer 318 to substantially fill the core enclosed by wetting layer 318. FIG. 4 shows electronic device 300 comprising a barrier metal 326 that optionally may have properties similar to barrier metal 314 or may be a dissimilar material. Also, FIG. 4 shows electronic device 300 comprising a wetting layer 330 that optionally may have properties similar to wetting layer 318 or may be a dissimilar material.

For some embodiments of electronic device 300, substrate 302 may comprise a completed or partially completed integrated circuit device. Optionally substrate 302 may be a semiconductor such as silicon or it may be another material suitable for the fabrication of electronic devices. One or more embodiments of the present invention comprise having the walls defining through-substrate via 310 at least partially covered by barrier metal 314.

One or more embodiments of the present invention include barrier metal 314 comprising at least one of the elements nickel and cobalt. According to one embodiment of the present invention, electronic device 300 has a thickness of barrier metal 314 that is about 0.2 micrometer to 1 micrometer and all values and ranges subsumed therein. For one or more embodiments of the present invention barrier metal 314 comprises at least one of the elements nickel and cobalt and the thickness of the barrier metal 314 is about 0.2 micrometer to 1 micrometer and all values and ranges subsumed therein.

Additional embodiments of the present invention may have wetting layer 318 comprising one or more of a variety of materials systems. Examples of materials systems suitable for use as wetting layer 318 include, but are not limited to: Wetting layer 318 comprising tin or a tin alloy. Wetting layer 318 comprising silver or a silver alloy. Wetting layer 318 comprising silver tungsten alloy with 3-4 atomic percent tungsten. Wetting layer 318 comprising copper or a copper alloy. Wetting layer 318 comprising cobalt tin alloy, cobalt copper alloy, cobalt silver alloy, cobalt copper tin alloy, cobalt copper silver alloy, cobalt silver tin alloy, or cobalt copper silver tin alloy. Wetting layer 318 comprising nickel copper alloy, nickel silver alloy, nickel copper silver alloy, nickel copper tin alloy, nickel silver tin alloy, or nickel copper silver tin alloy. Wetting layer 318 comprising iron tin alloy, iron copper alloy, iron silver alloy, iron copper tin alloy, iron copper silver alloy, iron silver tin alloy, or iron copper silver tin alloy. Wetting layer 318 comprising a thickness of nickel alloy having a first composition and a thickness of nickel alloy having a second composition. Wetting layer 318 comprising a thickness of cobalt alloy having a first composition and a thickness of cobalt alloy having a second composition. Wetting layer 318 comprising a thickness of iron alloy having a first composition and a thickness of iron alloy having a second composition. Wetting layer 318 further comprising boron and/or phosphorus.

In the foregoing specification, the invention has been described with reference to specific embodiments. However, one of ordinary skill in the art appreciates that various modifications and changes can be made without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. An electronic device comprising a metallization stack, the metallization stack comprising a barrier metal deposited electrolessly and a substantially gold-free wetting layer deposited electrolessly, the barrier metal contacting the wetting layer, and the wetting layer being wettable by solder, wherein the barrier metal has a thickness of 0.2 micrometer to 1 micrometer and all values and ranges subsumed therein, the barrier metal comprises at least one of the elements nickel and cobalt;

wherein the wetting layer comprises:
1. tin or a tin alloy;
2. silver tungsten alloy with 3-4 atomic percent tungsten;
3. cobalt tin alloy, cobalt copper alloy, cobalt silver alloy, cobalt copper tin alloy, cobalt copper silver alloy, cobalt silver tin alloy, or cobalt copper silver tin alloy;
4. nickel copper alloy, nickel silver alloy, nickel copper silver alloy, nickel copper tin alloy, nickel silver tin alloy, or nickel copper silver tin alloy;
5. iron tin alloy, iron copper alloy, iron silver alloy, iron copper tin alloy, iron copper silver alloy, iron silver tin alloy, or iron copper silver tin alloy;
6. a thickness of nickel alloy having a first composition and a thickness of nickel alloy having a second composition;
7. a thickness of cobalt alloy having a first composition and a thickness of cobalt alloy having a second composition; or
8. a thickness of iron alloy having a first composition and a thickness of iron alloy having a second composition;
further comprising one or more electrical contact pads being at least partially covered by the barrier metal and/or one or more through-substrate via conductors being at least partially covered by the barrier metal; and solder contacting the wetting layer.

2. The electronic device of claim 1, wherein the substrate has one or more through-substrate vias, the walls of the substrate forming the one or more vias are at least partially covered by the barrier metal and further comprising solder contacting the wetting layer to substantially fill the one or more vias.

3. The electronic device of claim 1, wherein the barrier metal comprises cobalt.

4. The electronic device of claim 1, wherein the wetting layer comprises tin or a tin alloy.

5. The electronic device of claim 1, wherein the wetting layer comprises silver tungsten alloy with 3-4 atomic percent tungsten.

6. The electronic device of claim 1, wherein the wetting layer comprises cobalt tin alloy, cobalt copper alloy, cobalt silver alloy, cobalt copper tin alloy, cobalt copper silver alloy, cobalt silver tin alloy, or cobalt copper silver tin alloy.

7. The electronic device of claim 6, wherein the wetting layer further comprises boron and/or phosphorus.

8. The electronic device of claim 1, wherein the wetting layer comprises nickel copper alloy, nickel silver alloy, nickel copper silver alloy, nickel copper tin alloy, nickel silver tin alloy, or nickel copper silver tin alloy.

9. The electronic device of claim 8, wherein the wetting layer further comprises boron and/or phosphorus.

10. The electronic device of claim 1, wherein the wetting layer comprises iron tin alloy, iron copper alloy, iron silver alloy, iron copper tin alloy, iron copper silver alloy, iron silver tin alloy, or iron copper silver tin alloy.

11. The electronic device of claim 10, wherein the wetting layer further comprises boron and/or phosphorus.

12. The electronic device of claim 1, wherein the wetting layer comprises a thickness of nickel tin alloy having a first composition and a thickness of nickel tin alloy having a second composition.

13. The electronic device of claim 1, wherein the wetting layer comprises a thickness of cobalt tin alloy having a first composition and a thickness of cobalt tin alloy having a second composition.

14. An electronic device comprising a metallization stack, the metallization stack comprising a barrier metal deposited electrolessly and a substantially gold-free wetting layer deposited electrolessly, the barrier metal contacting the wetting layer, and the wetting layer being wettable by solder wherein the barrier metal comprises at least one of the elements nickel and cobalt;

wherein the wetting layer comprises:
1. tin or a tin alloy;
2. silver tungsten alloy with 3-4 atomic percent tungsten;
3. cobalt tin alloy, cobalt copper alloy, cobalt silver alloy, cobalt copper tin alloy, cobalt copper silver alloy, cobalt silver tin alloy, or cobalt copper silver tin alloy;
4. nickel copper alloy, nickel silver alloy, nickel copper silver alloy, nickel copper tin alloy, nickel silver tin alloy, or nickel copper silver tin alloy;
5. iron tin alloy, iron copper alloy, iron silver alloy, iron copper tin alloy, iron copper silver alloy, iron silver tin alloy, or iron copper silver tin alloy;
6. a thickness of nickel alloy having a first composition and a thickness of nickel alloy having a second composition;
7. a thickness of cobalt alloy having a first composition and a thickness of cobalt alloy having a second composition; or
8. a thickness of iron alloy having a first composition and a thickness of iron alloy having a second composition;
further comprising one or more electrical contact pads being at least partially covered by the barrier metal and/or one or more through-substrate via conductors being at least partially covered by the barrier metal; and solder contacting the wetting layer.

15. The electronic device of claim 14, wherein the wetting layer further comprises boron and/or phosphorus.

16. The electronic device of claim 14, wherein the barrier metal comprises cobalt.

17. The electronic device of claim 14, wherein the substrate has one or more through-substrate vias, the walls of the substrate forming the one or more vias are at least partially covered by the barrier metal and further comprising solder contacting the wetting layer to substantially fill the one or more vias.

* * * * *